(12) United States Patent
Sone et al.

(10) Patent No.: US 10,349,545 B2
(45) Date of Patent: Jul. 9, 2019

(54) CIRCUIT UNIT

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Kosuke Sone, Mie (JP); Takahiro Maruyama, Mie (JP)

(73) Assignees: AutoNetworks Technologies, Ltd. (JP); Sumitomo Wiring Systems, Ltd. (JP); Sumitomo Electric Industries, Ltd. (JP)

( * ) Notice: Subject to any disclaimer, the term of this patent is extended or adjusted under 35 U.S.C. 154(b) by 0 days.

(21) Appl. No.: 16/005,979

(22) Filed: Jun. 12, 2018

(65) Prior Publication Data

US 2018/0368275 A1 Dec. 20, 2018

(30) Foreign Application Priority Data

Jun. 16, 2017 (JP) .................................. 2017-118605

(51) Int. Cl.
*H05K 5/06* (2006.01)
*H05K 7/20* (2006.01)
(Continued)

(52) U.S. Cl.
CPC ........... *H05K 5/065* (2013.01); *H05K 5/0008* (2013.01); *H05K 5/0082* (2013.01);
(Continued)

(58) Field of Classification Search
CPC ........ G06F 1/20; H05K 7/209; H05K 1/0203; H05K 7/2039; H05K 7/20409;
(Continued)

(56) References Cited

U.S. PATENT DOCUMENTS 7,224,582 B1 * 5/2007 Saturley .................... G06F 1/20
361/679.54
7,355,857 B2 * 4/2008 Pirillis ............... H05K 7/20418
165/80.3
(Continued)

FOREIGN PATENT DOCUMENTS

JP 5482590 2/2014

*Primary Examiner* — Adam B Dravininkas
(74) *Attorney, Agent, or Firm* — Gerald E. Hespos; Michael J. Porco; Matthew T. Hespos

(57) ABSTRACT

A circuit unit (10) includes a circuit body (11) having a resin portion (12) covering a circuit, first terminals (15) projecting from one edge of the resin portion (12) and second terminals (16) projecting from another edge part of the resin portion (12). A fixing member (20) made of metal is configured to fix the circuit body (11) to a base member (BM) by being mounted on the base member (BM) while being held in contact with the resin portion (12). A cover (30) having receptacles (35, 36) is fit to mating connectors (50A, 50B) while covering the first and second terminals (15, 16). The cover (30) is configured to cover the circuit body (11) and the fixing member (20). The cover (30) is formed with an opening (33) for exposing the fixing member (20) to outside.

5 Claims, 21 Drawing Sheets

(51) Int. Cl.
*H05K 5/00* (2006.01)
*H05K 5/02* (2006.01)
*H05K 5/03* (2006.01)

(52) U.S. Cl.
CPC ............ *H05K 5/0247* (2013.01); *H05K 5/03* (2013.01); *H05K 7/20436* (2013.01)

(58) Field of Classification Search
CPC .... H05K 1/0209; H05K 1/0204; H05K 1/181; H05K 7/1432; H05K 7/20509; H05K 7/2049; H05K 7/20854
See application file for complete search history.

(56) References Cited

U.S. PATENT DOCUMENTS

| | | | | |
|---|---|---|---|---|
| 7,457,126 B2 * | 11/2008 | Ahrens | ................ | G02B 6/4292 257/E23.088 |
| 7,539,018 B2 * | 5/2009 | Murr | ................... | H05K 7/20418 165/185 |
| 9,740,251 B2 * | 8/2017 | Mitsui | ....................... | G06F 1/20 |
| 2003/0161108 A1 * | 8/2003 | Bright | .................. | G02B 6/4201 361/707 |
| 2004/0055783 A1 * | 3/2004 | Masuda | ............. | H01L 23/3107 174/252 |
| 2005/0195565 A1 * | 9/2005 | Bright | .................... | H04B 1/036 361/688 |
| 2006/0023426 A1 * | 2/2006 | Murakami | .......... | B60R 16/0239 361/715 |
| 2010/0022113 A1 * | 1/2010 | Ito | ........................ | H05K 5/0286 439/325 |
| 2012/0240396 A1 * | 9/2012 | Becker | .................... | H05K 1/18 29/841 |
| 2013/0148313 A1 * | 6/2013 | Nakayama | .......... | F16H 61/0006 361/747 |
| 2013/0323955 A1 * | 12/2013 | Nishio | ................. | H01R 12/732 439/325 |

* cited by examiner

CIRCUIT UNIT

BACKGROUND

Field of the Invention

The invention relates to a circuit unit is disclosed in this specification.

Related Art

Publication of Japanese Patent No. 5482590 describes a circuit unit with an electronic circuit body having terminals arranged in a row and projecting from both ends of a resin package. The electronic circuit body is to be fixed on a placing surface of a base. A mounting member is mounted on the electronic circuit body and fixes the electronic circuit body to the base member side by being. A cover covers the electronic circuit body and the mounting member. Mounting portions are provided on both sides of the cover and are fixed to the base by fastening bolts and nuts while being overlapped on mounting portions of the electronic circuit body.

The mounting member is on the electronic circuit body in the configuration of Japanese Patent No. 5482590. Thus, heat of the electronic circuit body is transferred to the mounting member on the electronic circuit body. The heat transferred to the mounting member easily accumulates inside the cover and heat dissipation to outside may not be sufficient since the entire mounting member is covered with the cover.

This invention was completed on the basis of the above situation and aims to improve heat dissipation of a circuit unit.

SUMMARY

A circuit unit described in this specification includes a circuit body having a resin portion covering a circuit. A first terminal portion projects from one edge part of the resin portion and a second terminal portion projects from another edge part of the resin portion. A fixing member made of metal is mounted on a base while being held in contact with the resin portion and is configured to fix the circuit body to the base. A cover has receptacles to be fit to mating connectors while covering the first and second terminal portions. The cover is configured to cover the circuit body and the fixing member and is formed with an opening for exposing the fixing member to the outside.

According to this configuration, the circuit body is fixed to the base member by the fixing member made of metal and is fit to the mating connectors by the receptacles of the cover. If the cover covers the entire fixing member, heat transferred from the circuit body to the fixing member easily accumulates inside the cover and the dissipation of heat generated from the circuit body may not be sufficient. However, heat of the fixing member is dissipated through the opening of the cover according to this configuration. Thus, heat of the circuit body is less likely accumulate inside the cover and heat dissipation can be improved.

A heat dissipating projection may project out from a part of the fixing member exposed from the opening. According to this configuration, a contact area with outside air is increased by the heat dissipating projection to improve heat dissipation.

The fixing member may be secured to the cover. According to this configuration, it is not necessary to provide a separate member for fixing the fixing member and the cover. Thus, the number of components can be reduced and a manufacturing process of the circuit unit can be simplified.

The fixing member includes a plate-like fastening portion formed with a penetrating insertion hole to receive a shaft of a bolt serving as a fastening member. The cover includes an extending portion extending at a position overlapping the fastening portion. The extending portion is formed with a through hole larger than the insertion hole at a position continuous with the insertion hole. A head of the bolt or a nut insertable into the through hole. According to this configuration, the fixing member is secured to the cover. Thus, the circuit unit can be fixed to the base by fastening the fastening portion with the bolt. This makes it unnecessary to fasten the fastening portion with a fastening member, for example, a tubular metal collar fixed to the cover, and the number of components can be reduced.

The fixing member may include a fixing body to be mounted on the base and a heat dissipating portion locked to the fixing body. The heating radiating portion is exposed from the opening.

As explained herein, the invention improves heat dissipation of a circuit unit.

DETAILED DESCRIPTION

A first embodiment is described with reference to FIGS. 1 to 8.

Figure 1:
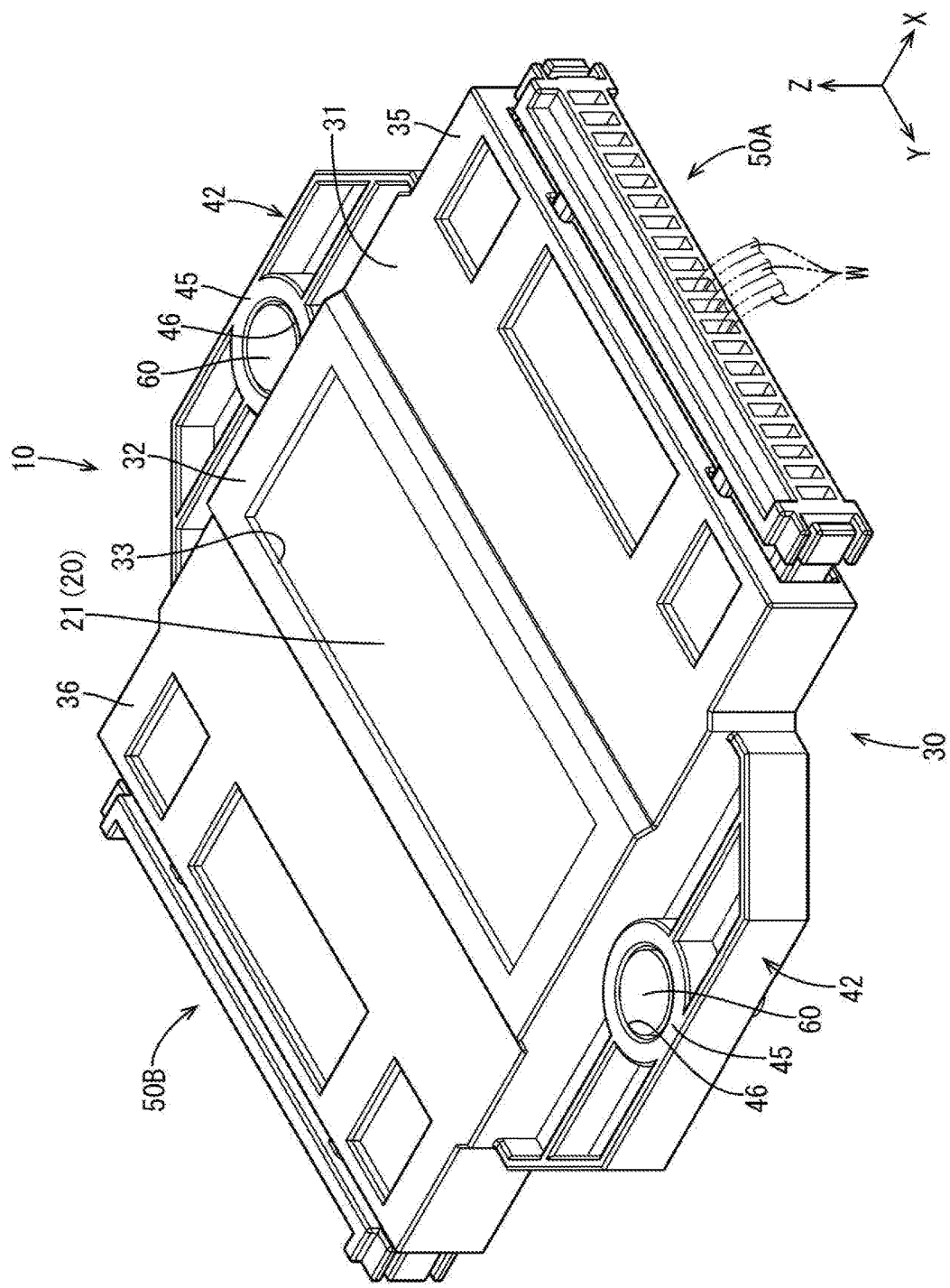
FIG. 1 is a perspective view showing a state where a first connector and a second connector are mounted in a circuit unit of a first embodiment.
Figure 2:
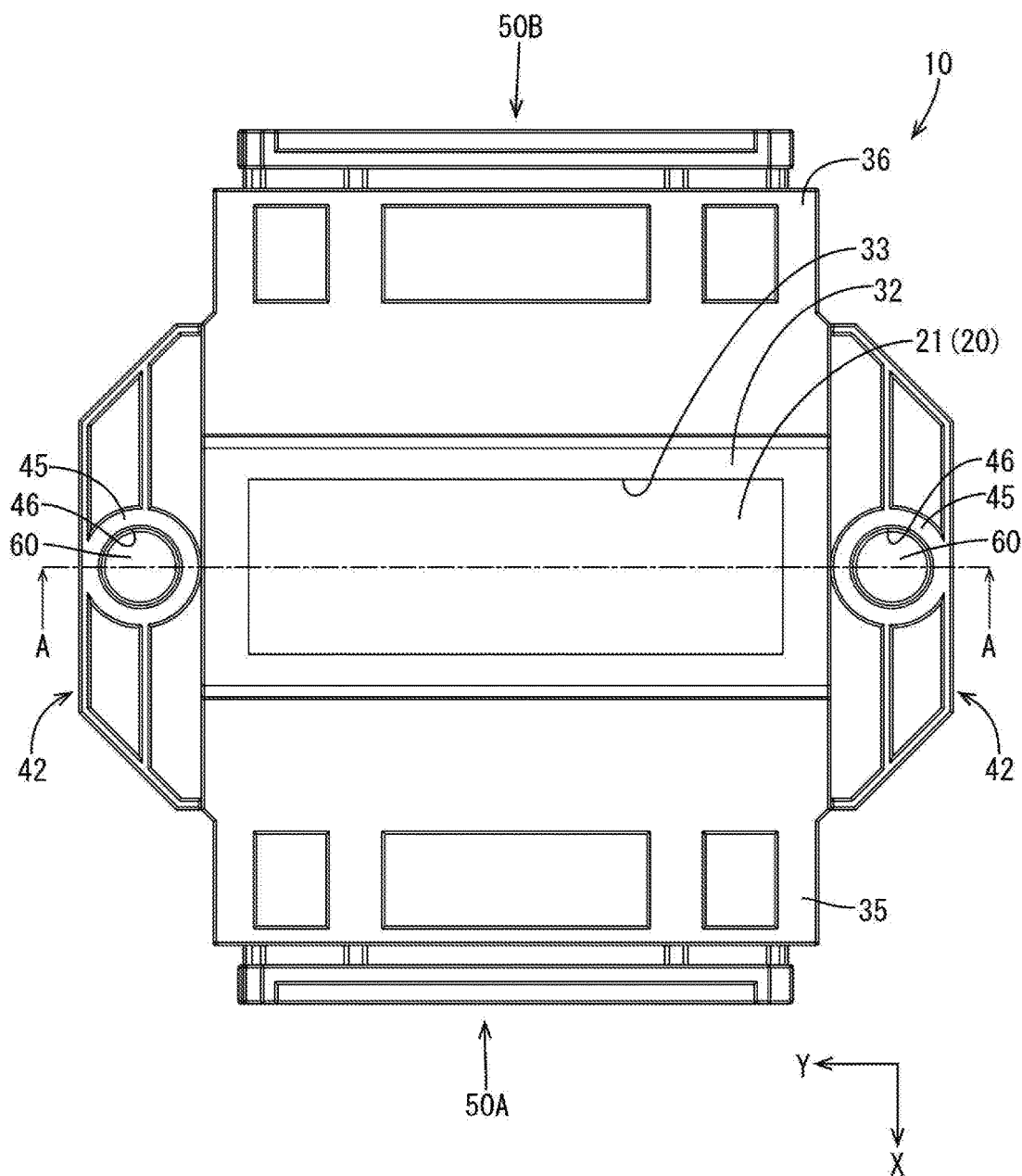
FIG. 2 is a plan view showing the state where the first connector and the second connector are mounted in the circuit unit.

A circuit unit 10 of this embodiment is accommodated in a case with circulating oil in an automatic transmission of a vehicle, such as an automotive vehicle, and can be used for the control of the automatic transmission. The circuit unit 10 can be arranged in an arbitrary orientation, but X, Y and Z directions of FIG. 1 are respectively referred to as forward, left and upward directions herein.

Figure 3:
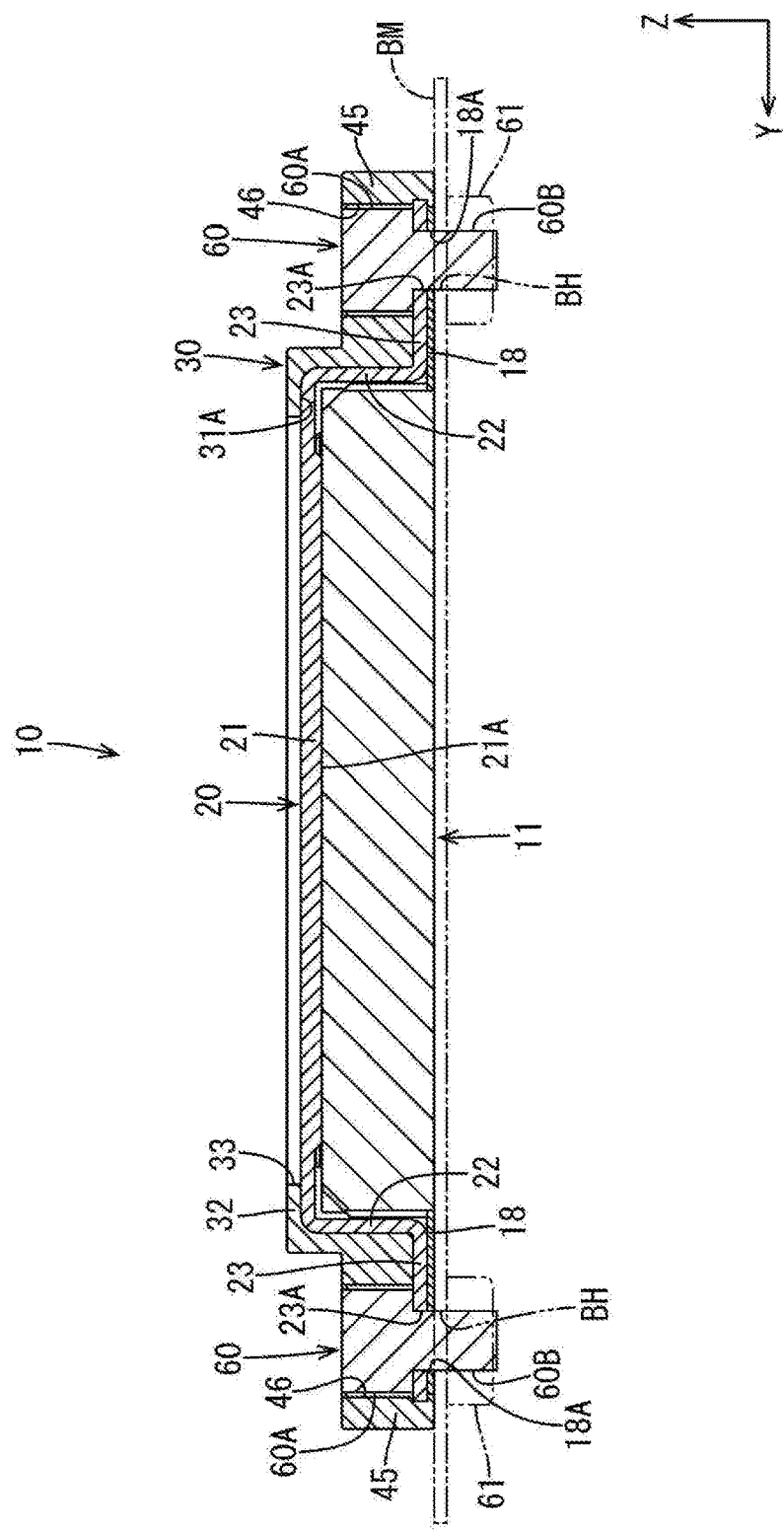
FIG. 3 is a section along A-A of FIG. 2.
Figure 4:
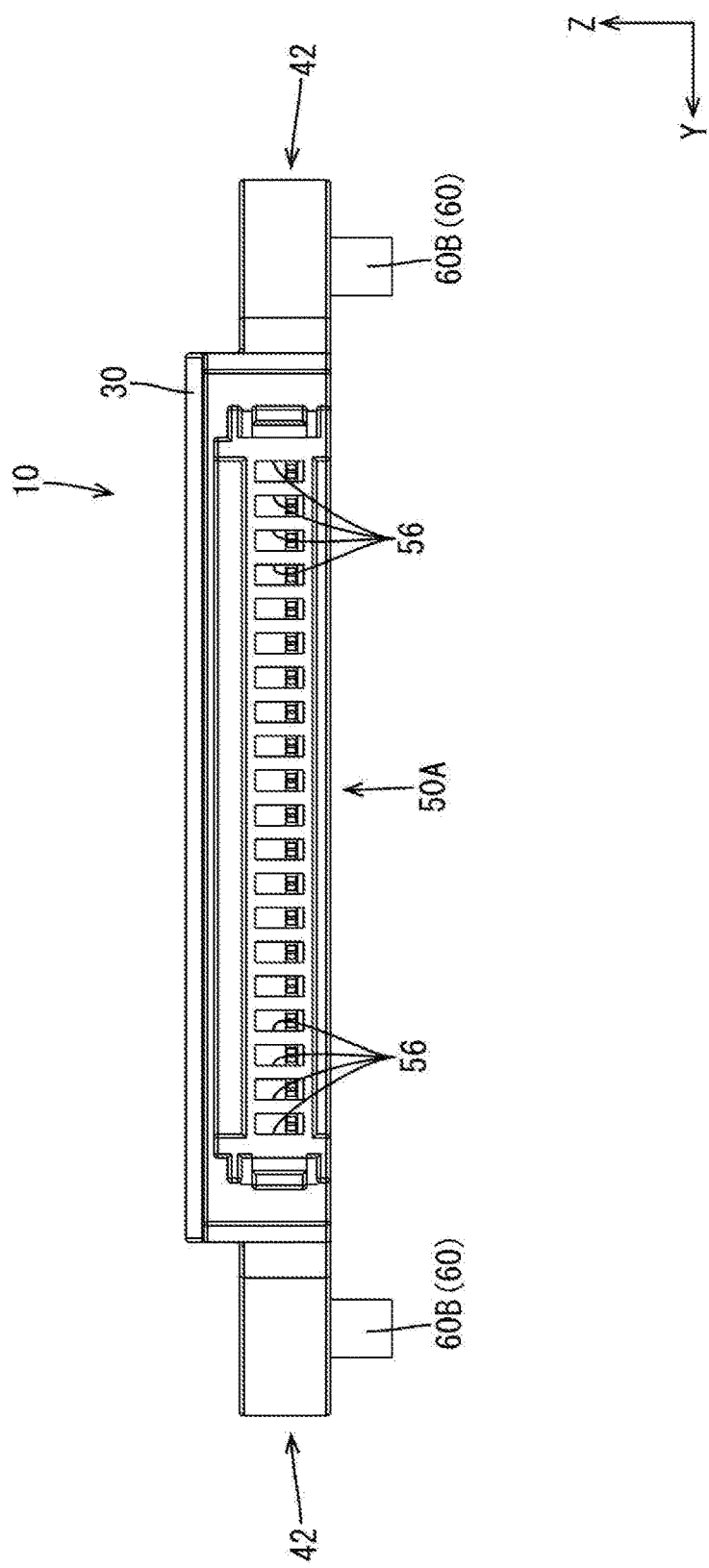
FIG. 4 is a front view showing the state where the first connector and the second connector are mounted in the circuit unit.
Figure 5:
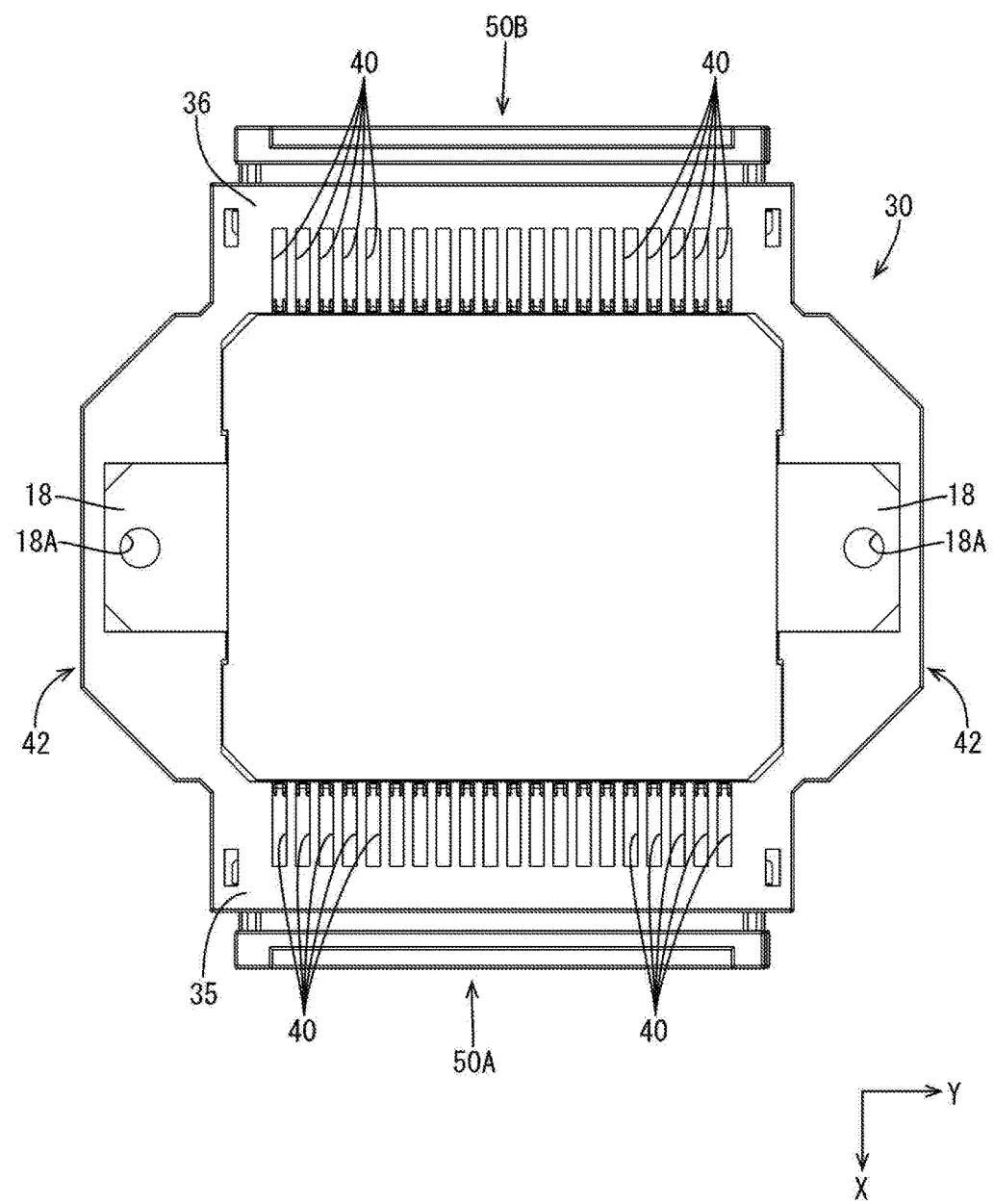
FIG. 5 is a bottom view showing the state where the first connector and the second connector are mounted in the circuit unit.

As shown in FIG. 3, the circuit unit 10 includes a circuit body 11, a fixing member 20 for fixing the circuit body 11 to a base member BM and a cover 30 for covering the circuit body 11 and the fixing member 20.

Figure 6:
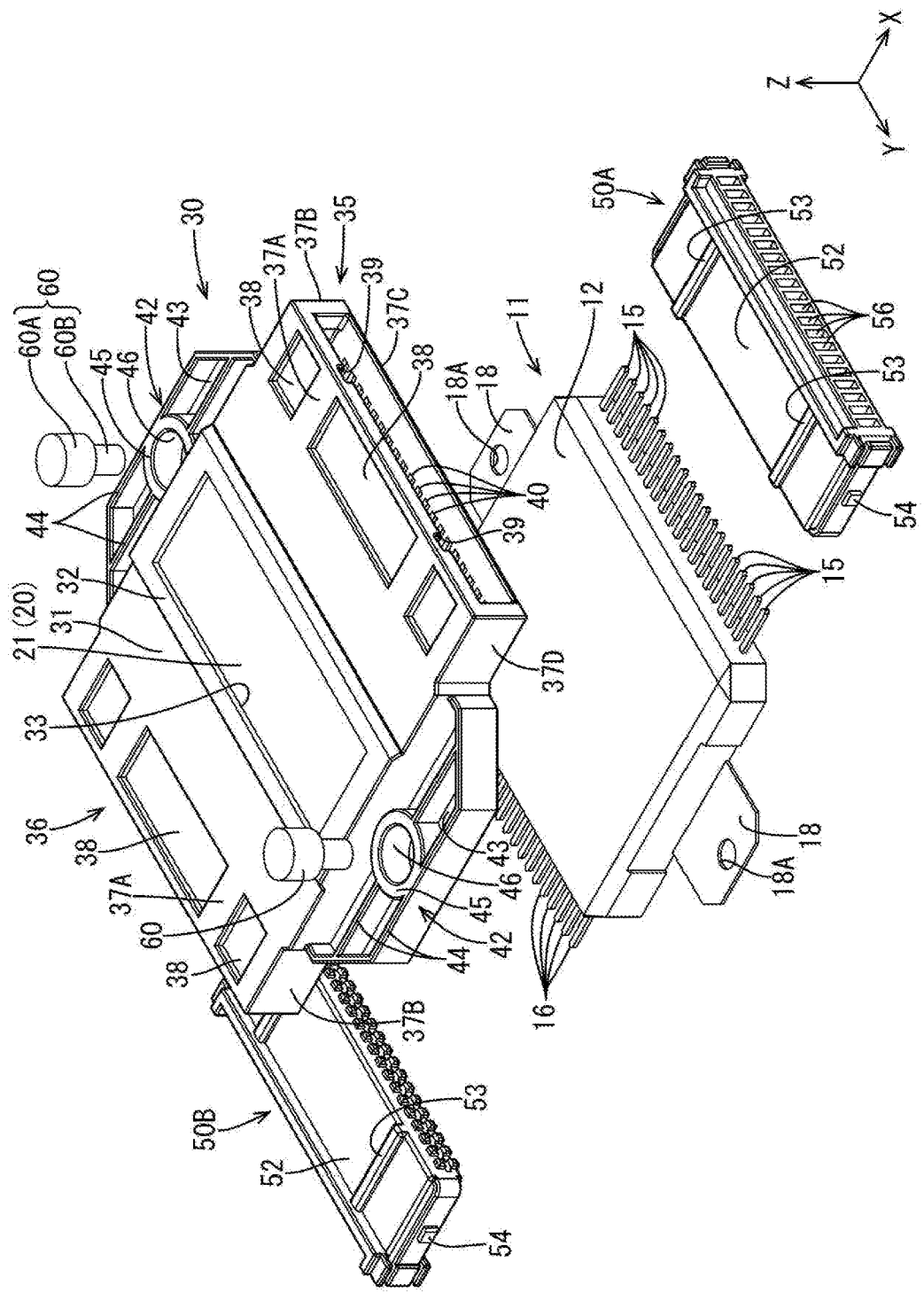
FIG. 6 is an exploded perspective view of the circuit unit, the first connector and the second connector.
Figure 7:
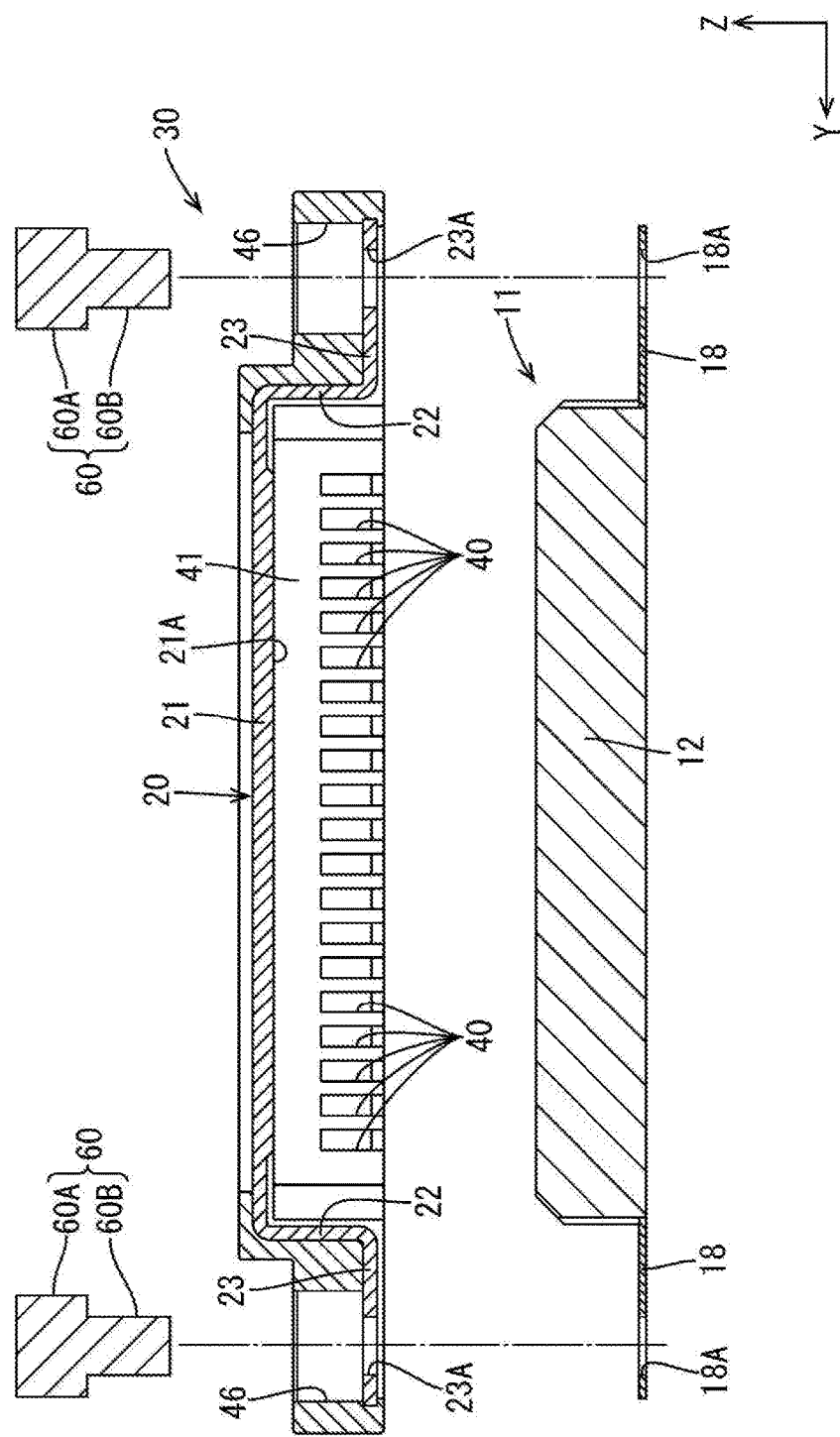
FIG. 7 is an exploded section of the circuit unit.
Figure 8:
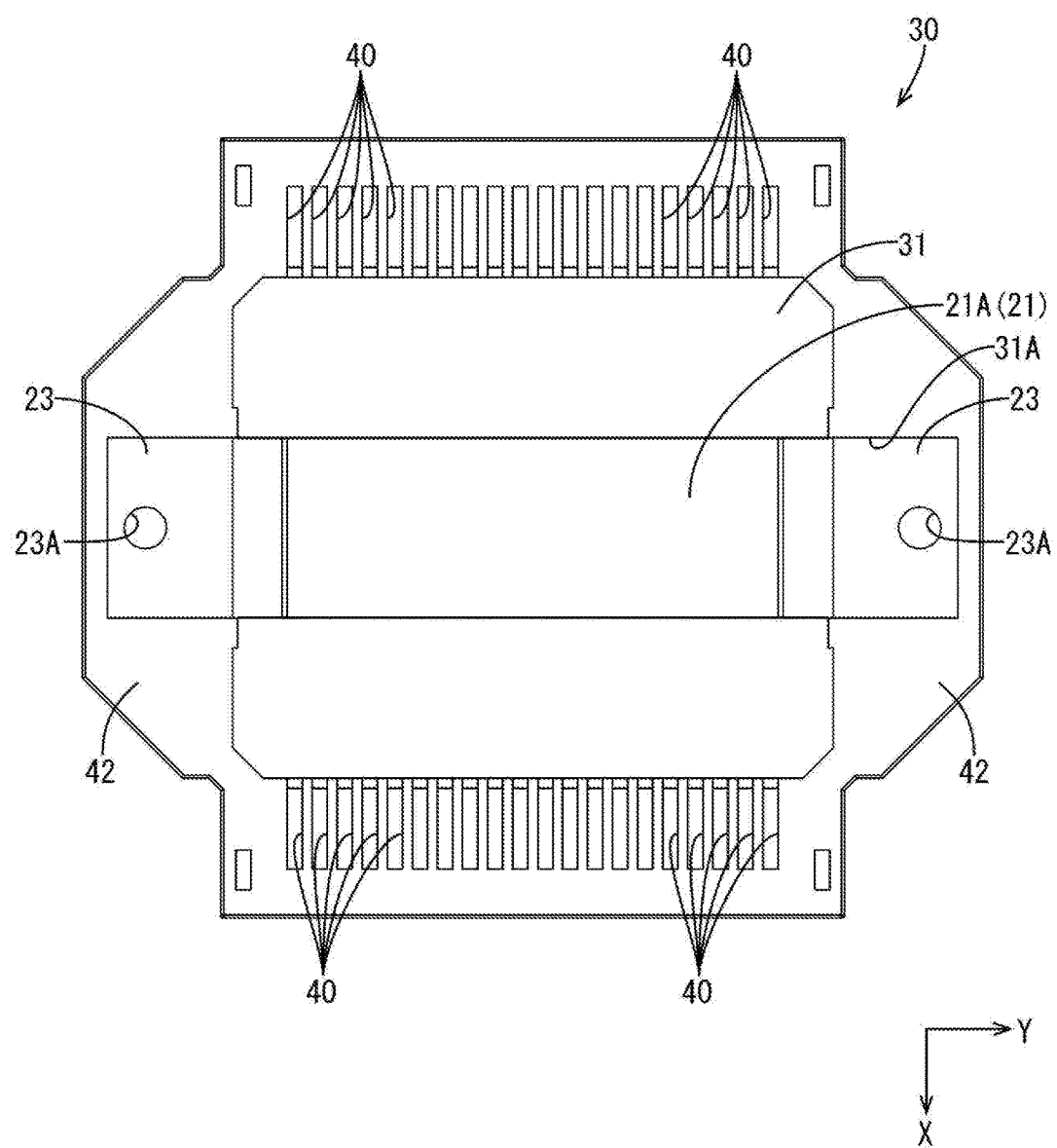
FIG. 8 is a bottom view showing a cover having a fixing member secured thereto.

As shown in FIG. 6, the circuit body 11 includes a resin portion 12 covering an unillustrated circuit in a sealed state. First terminals 15 project forward from a front end part of the resin portion 12 and second terminals 16 project rearward from a rear end part of the resin portion 12. Two mounting plates 18, 18 project toward both sides of the resin portion 12 and are mounted and fixed to the base member BM.

The circuit inside the resin portion 12 includes a circuit board and electronic components mounted on the circuit board. The electronic components can be, for example, a FET (Field Effect Transistor), a resistor, a coil and the like. The resin portion 12 is made of insulating synthetic resin, has the entire circuit embedded in the resin, and is in the form of a thin flat plate having a vertical thickness smaller than thicknesses in other directions. The circuit body 11 of this embodiment is formed by by insert molding.

The first and second terminals 15, 16 are bars that are arranged laterally at equal intervals in first and second rows respectively. Each terminal 15, 16 is connected to a conductive path of the circuit board inside the resin portion 12. The mounting plate 18 is rectangular shape and a mounting hole 18A penetrates through the mounting plate 18 for receiving a shaft 60B of a bolt 60.

As shown in FIG. 3, bolt holes BH penetrate through the base member BM and receive shaft portions 60B of the bolts 60. The base member BM can be a mounting target such as a case on which the circuit unit 10 is mounted. Note that the circuit unit 10 may be mounted on a mounting target such as a case via the base member BM.

The fixing member 20 is a plate made of metal with good heat conductivity, such as stainless steel, aluminum, aluminum alloy or iron and has a constant width. The fixing member 20 includes: a heat dissipating portion 21 held in close contact with the resin portion 12 for receiving heat of the resin portion 12; two fastening portions 23 to be fastened by the bolts 60 and the nuts 61; and two coupling portions 22 coupling the heat dissipating portion 21 and the fastening portions 23. The circuit body 11 is fit into a recessed part between the heat dissipating portion 21 and the coupling portions 22.

The heat dissipating portion 21 includes a thick portion 21A that protrudes down to have an increased thickness. The thick portion 21A is formed in a rectangular area long in a lateral direction and is held in close contact with the resin portion 12 over the entire surface thereof. Additionally, the thick portion 21A is formed in an area somewhat smaller than the entire upper surface of the resin portion 12.

The two fastening portions 23 have a size corresponding to the mounting plates 18 and are overlapped on the mounting plates 18. Each fastening portion 23 is formed with a circular insertion hole 23A into which the shaft 60B of the bolt 60 is inserted. The fixing member 20 can be formed by stamping and bending a metal plate material by a press machine.

The cover 30 is made of insulating synthetic resin and includes a body 31 disposed in an area covering the upper surface of the resin portion 12, as shown in FIG. 6. A first receptacle 35 is connected to a front end part of the body 31 and is fit to the first connector 50A. A second receptacle 36 is connected to a rear end part of the body 31 and is fit to the second connector 50B. The extending portions 42, 42 extend laterally of the body 31.

The body 31 is a plate and includes a rectangular frame 32 protruding up. The lower surface of the frame 32 has a recess 31A (FIGS. 3, 8) to which the fixing member 20 is secured and in which an upper side (a part) of the fixing member 20 is embedded. The frame 32 is joined and fixed to an edge of the heat dissipating portion 21 of the fixing member 20. The frame 32 is formed with an opening 33 for exposing the fixing member 20 to the outside. The opening 33 penetrates through the frame 32 and has a rectangular shape long in the lateral direction. As shown in FIG. 3, the opening 33 is dimensioned to include the entire thick portion 21A of the fixing member 20.

As shown in FIG. 6, the first and second receptacles 35, 36 are wide flat rectangular tubes with small vertical thicknesses. The first connector 50A is fit into the first receptacle 35, and the second connector 50B is fit into the second receptacle 36. The receptacles 35, 36 include facing walls 37A, 37C vertically facing each other and side walls 37B, 37D coupling the facing walls 37A, 37C.

Lightening portions 38 are recessed on the upper surfaces of the upper facing walls 37A, and guide grooves 39 are formed in the lower surfaces of the upper facing walls 37A for guiding the first and second connectors 50A, 50B. Slits 40 penetrate the lower facing walls 37C and the first and second terminals 15 and 16 are insertable therein from below. The slits 40 have shapes corresponding to the first or second terminals 15, 16, and are side by side in the lateral direction. The slits 40 penetrate the back walls 41 (FIG. 7) that close inner sides of the first and second receptacles 35, 36.

As shown in FIG. 6, the extending portion 42 includes a flat plate 43, reinforcing walls 44 rising from the plate 43 and a hollow cylindrical portion 45. As shown in FIG. 3, a through hole 46 penetrates though the hollow cylindrical portion 45 and a head 60A of the bolt 60 or the nut 61 is inserted therein. The through hole 46 is coaxial with the insertion hole 23A of the fixing member 20 and has a perfect circular shape with a diameter larger than that of the insertion hole 23A.

The first and second connectors 50A, 50B have the same shape, and connector terminals (not shown) are accommodated in synthetic resin-made connector housings 51 of the connectors 50A, 50B. Each connector housing 51 includes an inner fitting 52 to be fit into the first or second receptacle 35, 36, and ridges 53 to be inserted into the guide grooves 39 extend in a front-rear direction on the outer surface of the inner fitting 52. Locked portions 54 project on side surfaces of the inner fitting 52 and restrict separation of the connector housing 51 by being locked by locking portions (not shown) recessed on the inner surface of the first or second receptacle 35, 36. The connector housing 51 is formed with laterally arranged cavities 56 capable of accommodating the connector terminals (not shown). The connector terminals are locked in the respective cavities 56. When the connector 50A, 50B is fit into the corresponding receptacle 35, 36, the connector terminals contact the first or second terminals 15, 16. The connector terminals are accommodated in the cavities 556 while being connected to wires W (FIG. 1), such as by crimping, and the wires W are drawn out to outside through openings of the cavities 56.

According to this embodiment, the following functions and effects are exhibited.

The circuit unit 10 includes the circuit body 11 having the resin portion 12 covering the circuit. The first terminals 15 project from one edge of the resin portion 12 and the second terminals 16 project from another edge of the resin portion 12. The fixing member 20 made of metal is configured to fix the circuit body 11 to the base member BM by being mounted on the base member BM while being held in contact with the resin portion 12. The cover 30 has receptacles 35, 36 to be fit to the mating connectors 50A, 50B while covering the first and second terminals 15, 16. The cover 30 is configured to cover the circuit body 11 and the fixing member 20, and the cover 30 is formed with the opening 33 for exposing the fixing member 20 to outside.

According to this embodiment, the circuit body 11 is fixed to the base member BM by the fixing member 20 made of metal, and is fit to the mating connectors 50A, 50B by the receptacles 35, 36 of the cover 30. If the cover 30 covered the entire fixing member 20, heat transferred from the circuit body 11 to the fixing member 20 easily would accumulate in the cover 30 and there is a concern about the dissipation of heat from the circuit body 11. On the other hand, since the heat of the fixing member 20 can be dissipated through the opening 33 of the cover 30, the heat of the circuit body 11 is less likely to accumulate inside the cover 30 and heat dissipation can be improved.

Further, the fixing member 20 is fixed to the cover 30 by insert molding. According to this configuration, it is not necessary to provide a separate member for fixing the fixing member 20 and the cover 30. Therefore, the number of components can be reduced and a manufacturing process of the circuit unit 10 can be simplified.

The fixing member 20 includes the plate-like fastening portions 23 formed with the insertion holes 23A that receive the shafts 60B of the bolts 60. The cover 30 includes the extending portions 42 extending at positions overlapping the fastening portions 23. Each extending portion 42 is formed with the through hole 46 larger than the insertion hole 23A at the position continuous with the insertion hole 23A, and the head 60A of the bolt 60 or the nut 61 is insertable into the through hole 46. According to this configuration, the fixing member 20 is secured to the cover 30. Thus, the circuit unit 10 can be fixed to the base member BM by using the bolts 60 to fasten the fastening portions 23. This makes it unnecessary to fasten the fastening portions 23 with fastening members, for example, using tubular metal collars fixed to the cover, and the number of components can be reduced.

Figure 9:
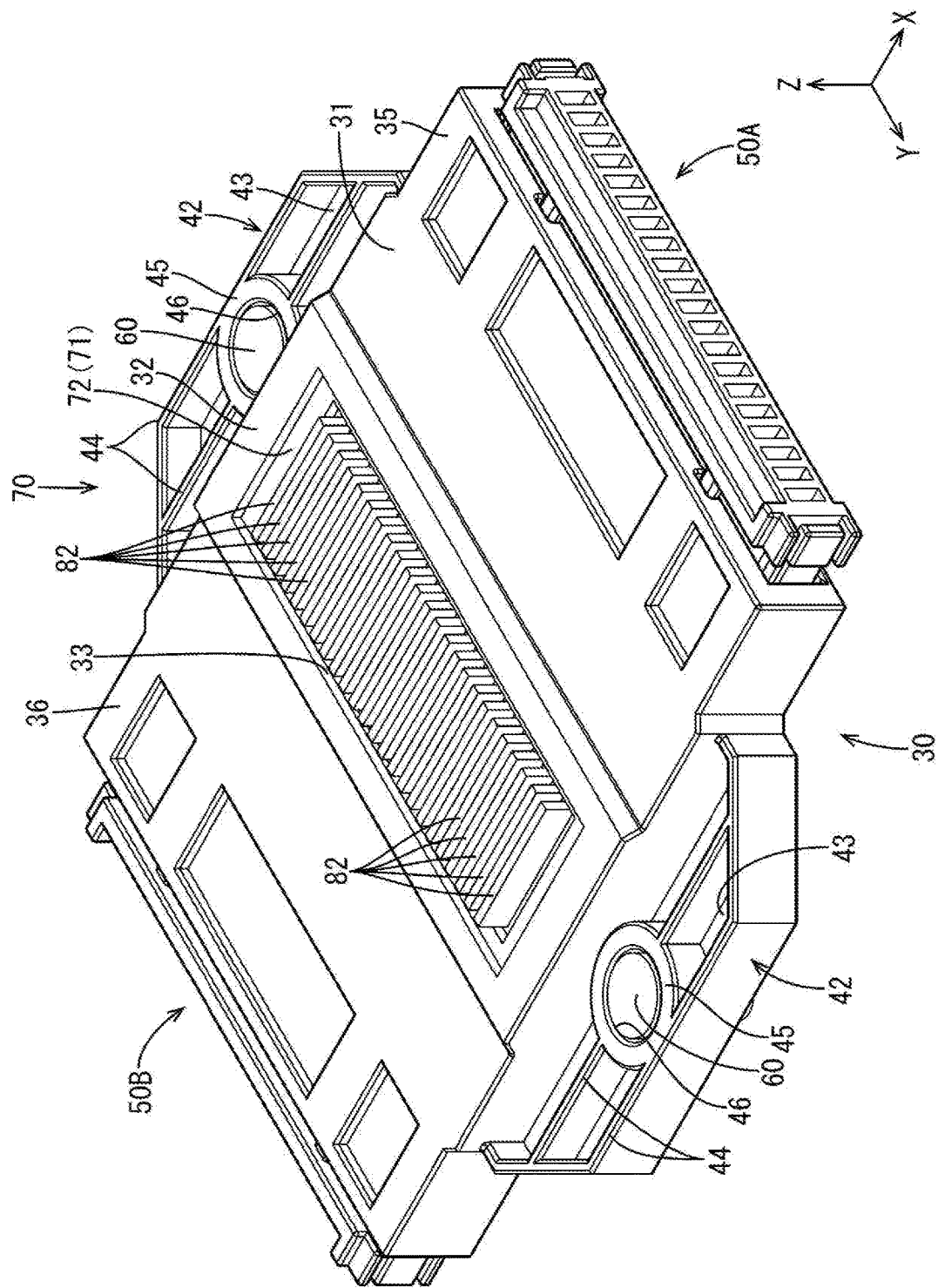
FIG. 9 is a perspective view showing a state where a first connector and a second connector are mounted in a circuit unit of a second embodiment

Next, a second embodiment is described with reference to FIGS. 9 to 13. Although the heat dissipating portion 21 of the fixing member 20 of the first embodiment has the flat upper surface, heat dissipating projections 82 are provided on the upper surface of a fixing member 71 in a circuit unit 70 of the second embodiment, as shown in FIG. 9. In the following description, the same components as in the first embodiment are denoted by the same reference signs and not described.

Figure 11:
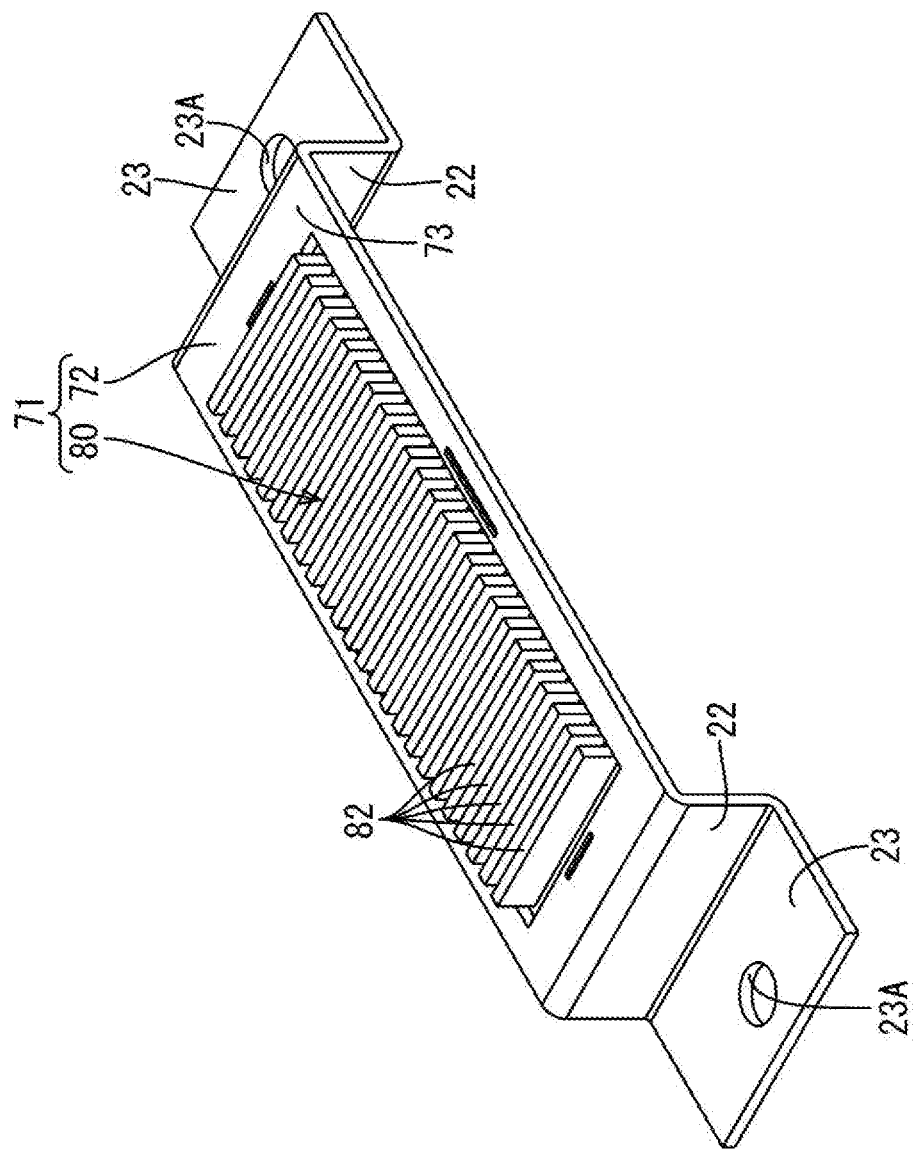
FIG. 11 is a perspective view showing a fixing member.
Figure 12:
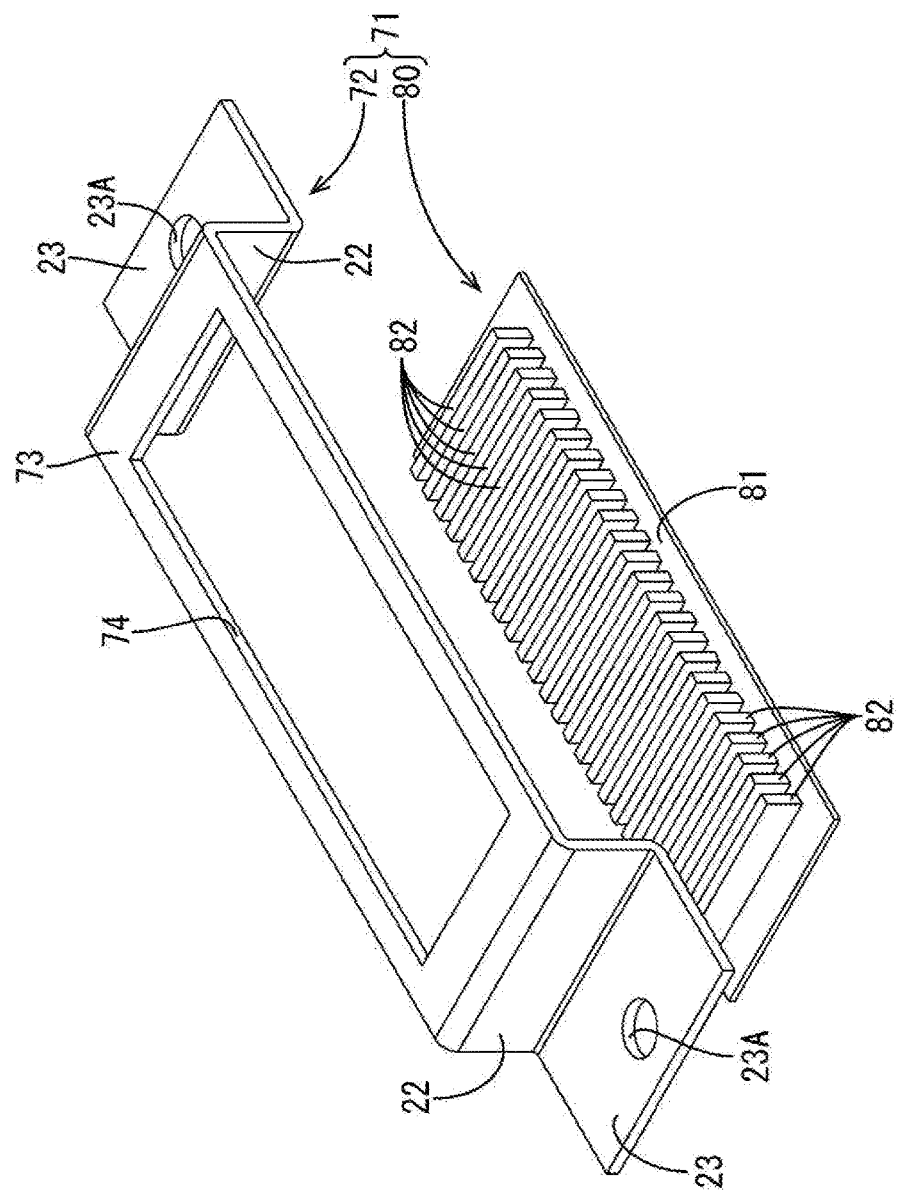
FIG. 12 is an exploded perspective view of the fixing member.

As shown in FIGS. 11 and 12, the fixing member 71 includes a fixing body 72 and a heat dissipating portion 80. The fixing body 72 is, for example, made of metal or synthetic resin and includes a rectangular frame-like portion 73, two fastening portions 23 to be fastened by bolts 60 and nuts 61 and two couplings 22 coupling the frame-like portion 73 and the fastening portions 23.

A wide rectangular exposure hole 74 penetrates through the frame-like portion 73. The fastening portions 23 have a size corresponding to mounting plates 18 and overlap on the mounting plates 18. A circuit body 11 is fit into a recessed part between the frame-like portion 73 and the couplings 22.

Figure 10:
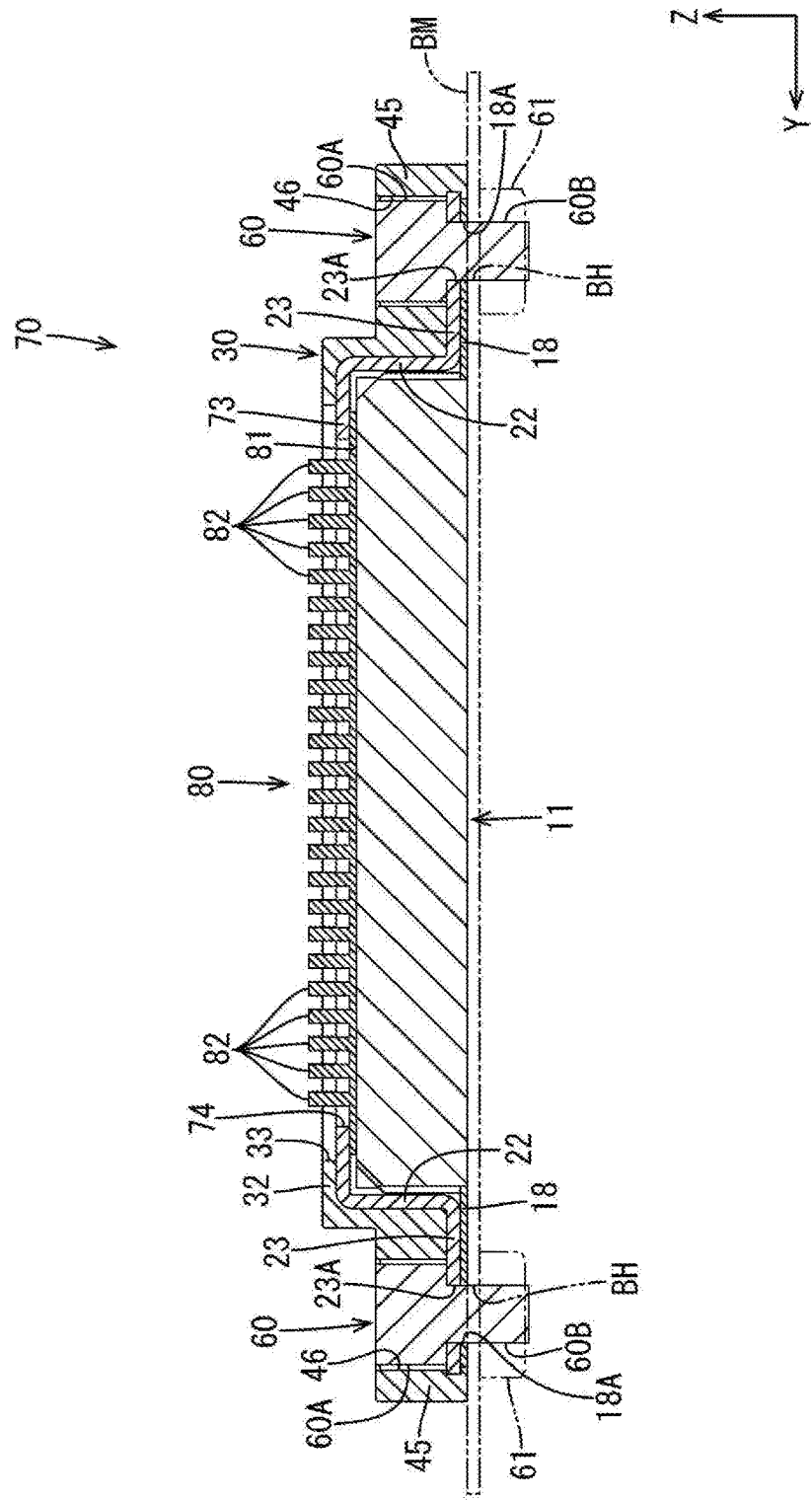
FIG. 10 is a section of the circuit unit.
Figure 13:
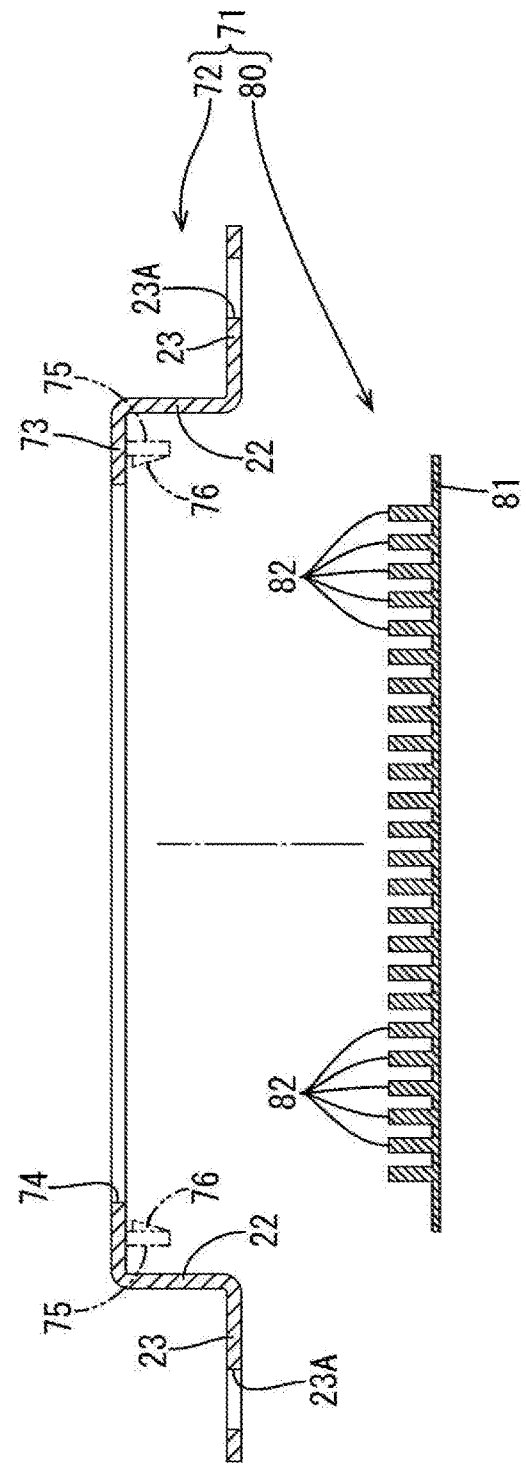
FIG. 13 is an exploded section of the fixing member.

The heat dissipating portion 80 is made of a metal plate such as stainless steel, aluminum, aluminum alloy or iron, and includes a placing portion 81 in the form of a flat plate to be placed in close contact with a resin portion 12 over the entire surface. The heat dissipating projections 82 in the form of fins rise like comb teeth from the placing portion 81, as shown in FIG. 10. The heat dissipating projections 82 are formed at a predetermined height and are disposed such that the upper ends of the heat dissipating projections 82 are higher than the upper surface of the fixing body 72. Left and right ends of the placing portion 81 are joined and fixed to an edge of the exposure hole 74 in the frame-like portion 73 of the fixing body 72. The fixing body 72 can be formed by stamping and bending a metal plate material by a press machine, and the heat dissipating portion 80 can be formed, for example, by extrusion. Note that although the fixing body 72 and the heat dissipating portion 80 are joined in this embodiment, there is no limitation to this. For example, the fixing body 72 (or heat dissipating portion 80) may be provided with restricting portions 75, 75 for restricting the separation of the fixing body 72 and the heat dissipating portion 80 from each other by being locked to the heat dissipating portion 80 (or fixing body 72), as shown in FIG. 13. These restricting portions 75, 75 are, for example, resilient deflection pieces projecting down from the frame-like portion 73 and provided with claws 76 projecting in on tip parts. In this way, ends of the placing portion 81 are sandwiched between the claws 76, 76 and the frame-like portion 73 and the heat dissipating portion 80 is fixed to the fixing body 72 if the placing portion 81 is fit between the restricting portions 75, 75 while the restricting portions 75, 75 are deflected. Further, the fixing body 72 may be provided with a recess into which the heat dissipating portion 80 is fit.

According to the second embodiment, the heat dissipating projections 82 project out in a part of the fixing member 71 exposed from an opening 33, and a contact area with outside air is increased by the heat dissipating projections 82. Thus, heat dissipation can be improved.

Figure 14:
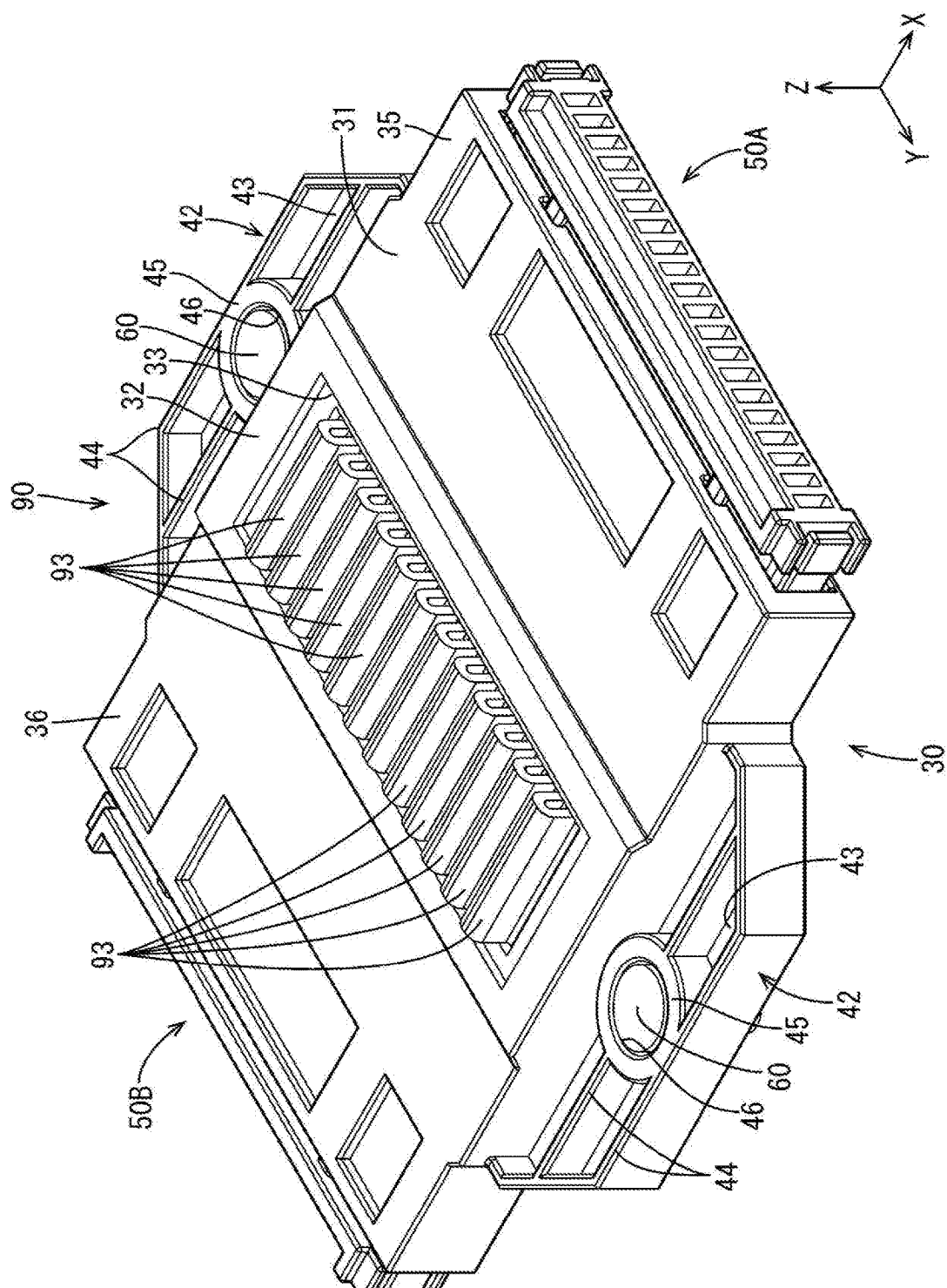
FIG. 14 is a perspective view showing a state where a first connector and a second connector are mounted in a circuit unit of a third embodiment.
Figure 15:
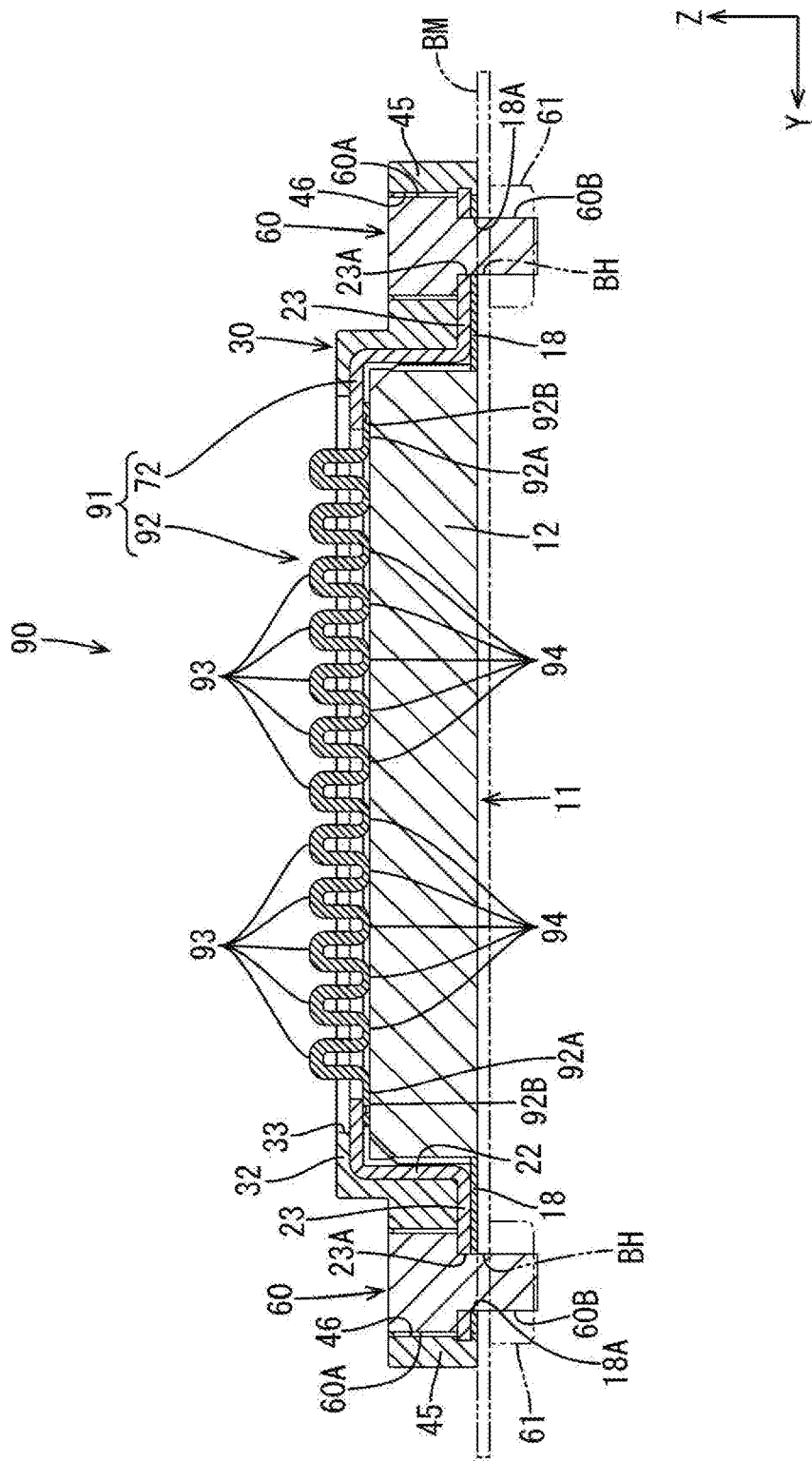
FIG. 15 is a section of the circuit unit.

A third embodiment is described with reference to FIGS. 14 to 18. A circuit unit 90 of the third embodiment is formed with wavy heat dissipating projections 93, as shown in FIG. 14. In the following description, the same components as in the above embodiments are denoted by the same reference signs and not described.

Figure 16:
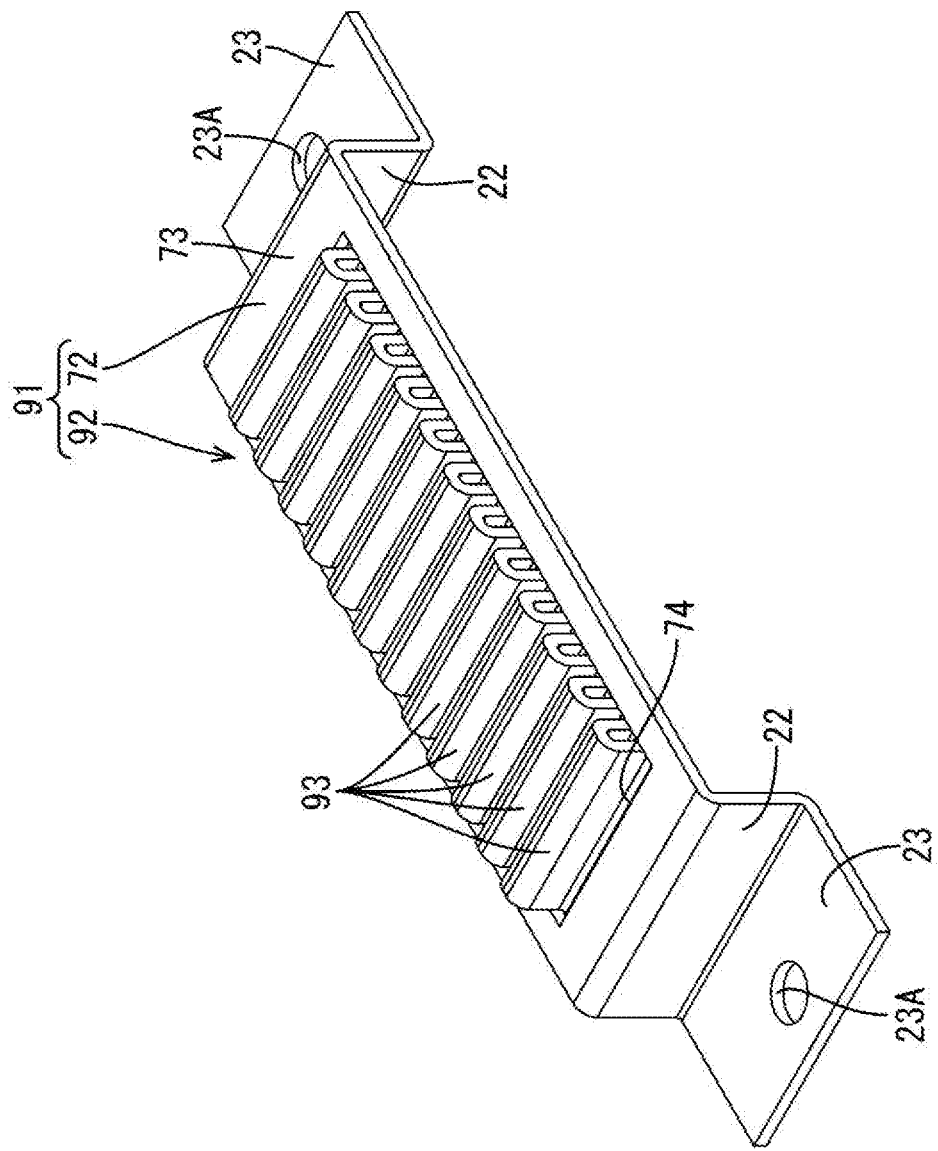
FIG. 16 is a perspective view showing a fixing member.
Figure 17:
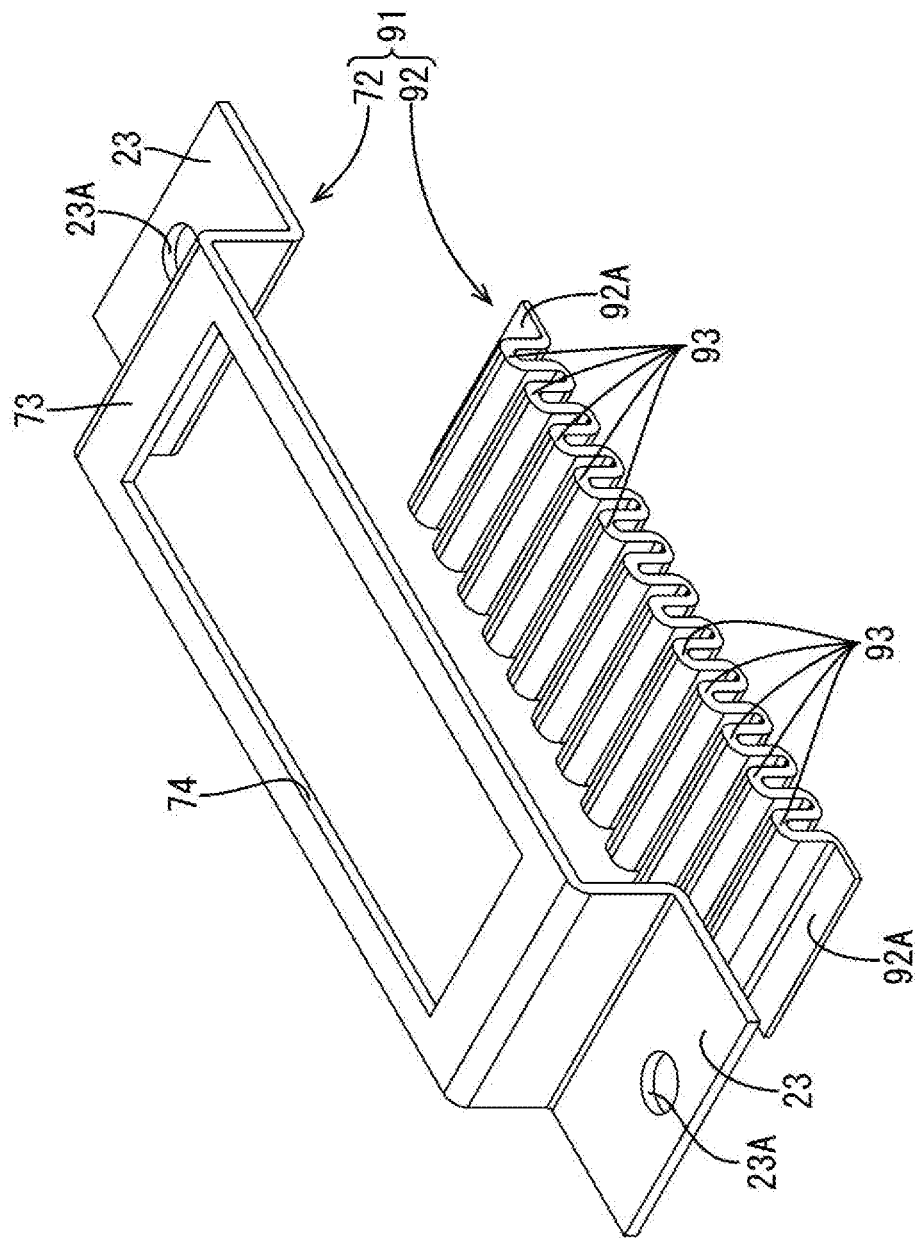
FIG. 17 is an exploded perspective view of the fixing member.
Figure 18:
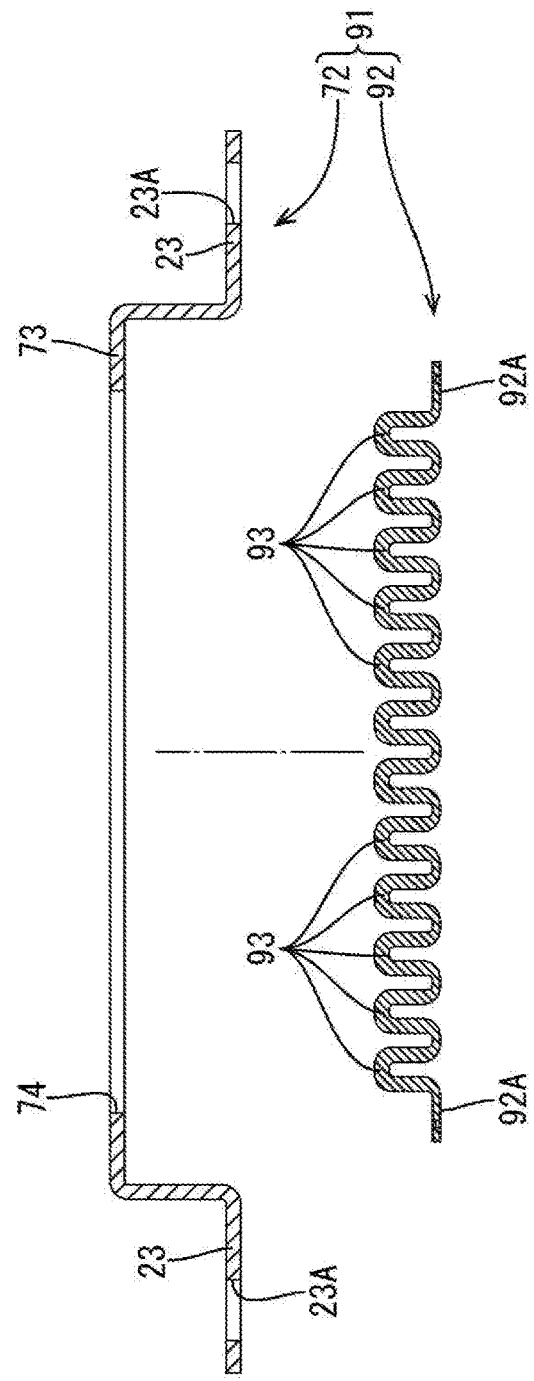
FIG. 18 is an exploded section of the fixing member.

As shown in FIGS. 16 and 17, the fixing member 91 includes a fixing body 72 and a heat dissipating portion 92. The heat dissipating portion 92 is, for example, made of metal plate such as stainless steel, aluminum, aluminum alloy or iron, and heat dissipating projections 93 curved into a U-shape are connected in a wave-like manner in a lateral direction. Recesses are formed between adjacent heat dissipating projections 93. Sides opposite to the recesses serve as projections 94, and tip parts of the projections 94 are placed on the upper surface of a resin portion 12. Left and right end parts of the heat dissipating portion 92 are formed into connecting portions 92A in the form of laterally extending flat plates. Engaging portions 92B are recessed on the lower surfaces (or upper surfaces) of the connecting portions 92A and, for example, are engaged with engaged portions on the lower surface of the frame-like portion 73 (or upper surface of the resin portion 12) by welding (or by concaveconvex fitting), and the heat dissipating portion 92 is positioned at an edge of an exposure hole 74 in a frame-like portion 73 of the fixing body 72.

Figure 19:
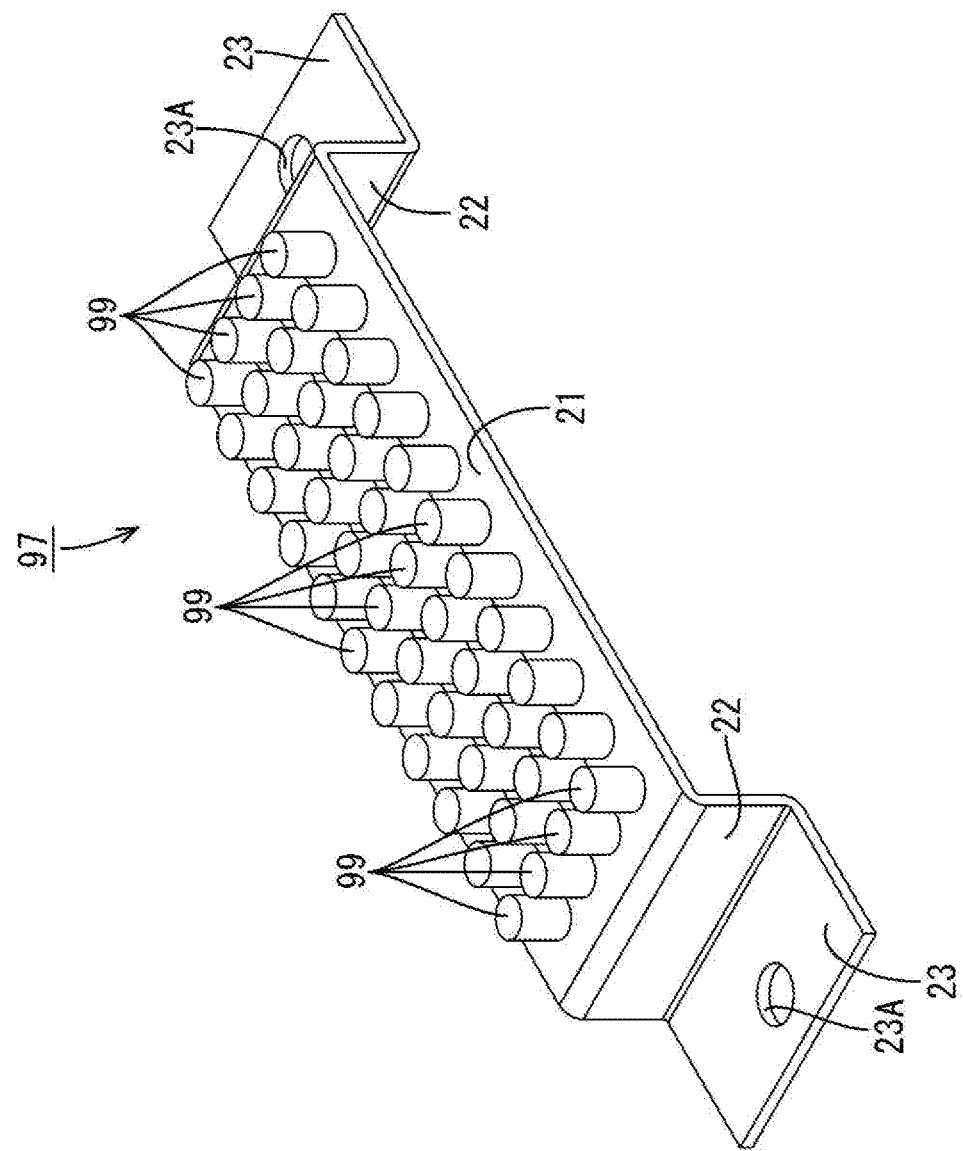
FIG. 19 is a perspective view showing a fixing member of a fourth embodiment.
Figure 20:
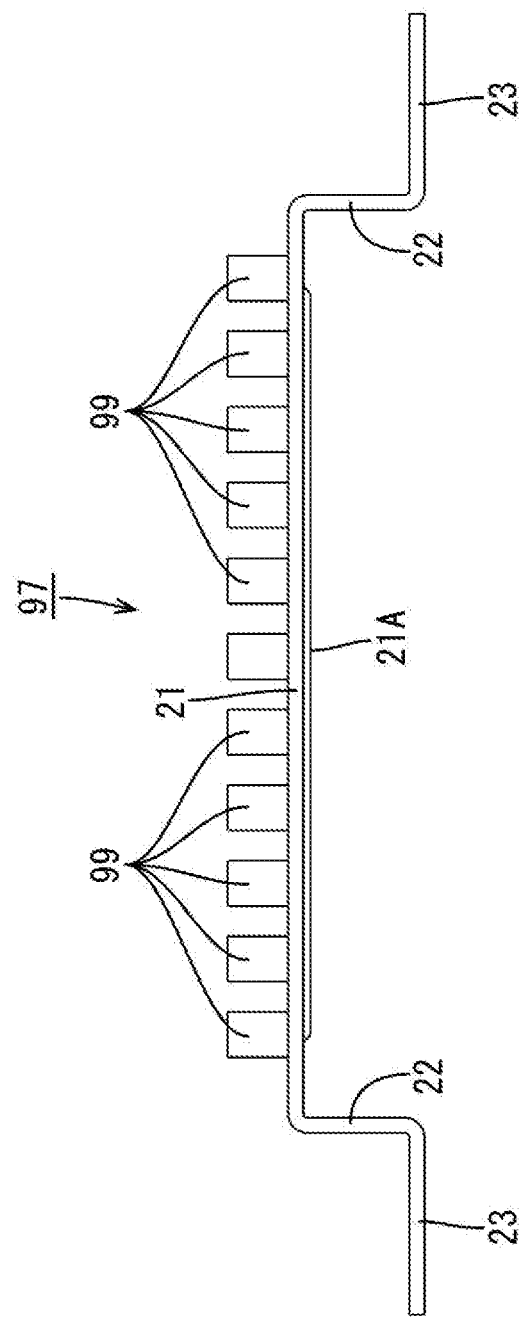
FIG. 20 is a front view showing the fixing member.
Figure 21:
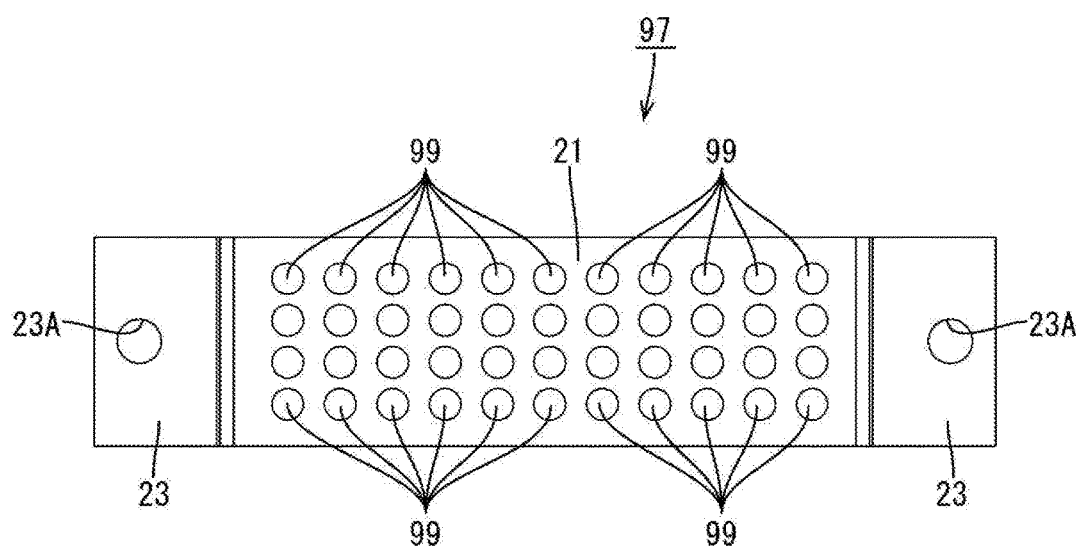
FIG. 21 is a plan view showing the fixing member.

A fourth embodiment is described with reference to FIGS. 19 to 21. In the fourth embodiment, upwardly projecting heat dissipating projections 99 are arranged in longitudinal and lateral directions, as shown in FIG. 19. In the following description, the same components as in the first embodiment are denoted by the same reference signs and not described.

A fixing member 97 for fixing a circuit body 11 to a base member BM is made of metal with good heat conductivity, such as stainless steel, aluminum, aluminum alloy or iron. The fixing member 97 is in the form of a plate having a constant width and includes, as shown in FIG. 19, a heat dissipating portion 21 in the form of a flat plate for receiving heat of a resin portion 12 by being held in close contact with the resin portion 12. Cylindrical heat dissipating projections 99 project up from the heat dissipating portion 21. Two fastening portions 23 to be fastened by bolts 60 serve as fastening members, and two couplings 22 couple the heat dissipating portion 21 and the fastening portions 23. The circuit body 11 is fit into a recess between the heat dissipating portion 21 and the couplings 22. The heat dissipating projections 99 project perpendicular to a plate surface of the heat dissipating portion 21 and are aligned side by side in the longitudinal and lateral directions.

The invention is not limited to the above described and illustrated embodiments. For example, the following embodiments also are included in the scope of the invention.

The shape of the heat dissipating portion 21, 80, 92 is not limited to those of the above embodiments. For example, a different number of heat dissipating projections 82, 93, 99 having a different shape and a different size may be provided.

Although the first and second terminals 15 and 16 are formed on the sides opposite to each other in the circuit body 11, there is no limitation to this and the terminals may be at other positions. For example, either the first or second terminals 15 or 16 may project from a side surface of the resin portion 12 so that the first and second terminals 15 and 16 project in directions intersecting each other.

Although the fixing member 20 is secured to the cover 30 by insert molding, there is no limitation to this. For example, the fixing member 20 may be secured to the cover 30 by an adhesive or the like.

LIST OF REFERENCE SIGNS 10, 70, 90: circuit unit
11: circuit body
12: resin portion
15: first terminal
16: second terminal
20, 71, 91, 96, 97: fixing member
21A: thick portion
21, 80, 92: heat dissipating portion
23: fastening portion
23A: insertion hole
30: cover
33: opening
35: first receptacle
36: second receptacle
46: through hole
50A: first connector
50B: second connector
60: bolt
61: nut
72: fixing body
82, 93, 99: heat dissipating projection
BM: base member

What is claimed is:

1. A circuit unit, comprising:
a circuit body (11) including a resin portion (12) covering a circuit, a first terminal (15) projecting from a first edge of the resin portion (12) and a second terminal (16) projecting from a second edge of the resin portion (12);
a fixing member (20, 71, 91, 96, 97) made of metal and configured to fix the circuit body to a base member by being mounted on the base member while being held in contact with the resin portion (12), the fixing member (20, 71, 91, 96, 97) including a heat dissipating portion (21) held in close contact with the resin portion (12) of the body (11) and fastening portions (23) coupled to the heat dissipating portion (21) and fastened to the base member (BM); and
a cover (30) covering the circuit body (11) and the fixing member (20, 71, 91, 96, 97) and fastened to the base member (BM), the cover (30) including receptacles (35, 36) to be fit to mating connectors while covering the first and second terminals (15, 16) and a body (31) having a lower surface arranged to face the fixing member (21), an opening (33) penetrating through the body (31) at a position corresponding to the heat dissipating portion (21), a frame (32) projecting from the body (31) and circumferentially surrounding the opening (33), and a recess (31A) formed in a lower surface of the frame (32) into which the fixing member (21) is secured.

2. The circuit unit of claim 1, wherein the heat dissipating portion projects outward from the opening.

3. The circuit unit of claim 1, wherein:
the fastening portions of the fixing member are plate-like fastening portions formed with a penetrating insertion hole into which a shaft of a bolt serving as a fastening member is insertable;
the cover includes an extending portion extending at a position overlapping with the fastening portion; and
the extending portion is formed with a through hole larger than the insertion hole at a position continuous with the insertion hole, a head portion of the bolt or a nut being insertable into the through hole.

4. The circuit unit of claim 3, wherein the fixing member includes a fixing body to be mounted on the base member and the heat dissipating portion is locked to the fixing body by being joined or retained, the heat dissipating portion being exposed from the opening.

5. The circuit unit of claim 1, wherein the heat dissipating portion has a lower surface facing the resin portion of the body, an upper surface opposite the lower surface, and a thickness dimension between the upper and lower surfaces, and
a portion of the heat dissipating portion aligned with the resin portion of the body is a thick heat dissipating portion having a thickness larger than the thickness of the heat dissipating portion adjacent to the thick heat dissipating portion.

* * * * *